(12) United States Patent
Hayakawa et al.

(10) Patent No.: US 11,431,153 B2
(45) Date of Patent: Aug. 30, 2022

(54) SEMICONDUCTOR OPTICAL AMPLIFIER, LIGHT OUTPUT APPARATUS, AND DISTANCE MEASURING APPARATUS

(71) Applicant: FUJIFILM Business Innovation Corp., Tokyo (JP)

(72) Inventors: Junichiro Hayakawa, Ebina (JP); Akemi Murakami, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 709 days.

(21) Appl. No.: 16/440,577

(22) Filed: Jun. 13, 2019

(65) Prior Publication Data
US 2019/0386465 A1  Dec. 19, 2019

(30) Foreign Application Priority Data

Jun. 19, 2018  (JP) .............................. JP2018-115845
Feb. 19, 2019  (JP) .............................. JP2019-027828

(51) Int. Cl.
| H01S 5/50 | (2006.01) |
| H01S 5/125 | (2006.01) |
| H01S 5/42 | (2006.01) |
| H01S 5/183 | (2006.01) |

(52) U.S. Cl.
CPC ................ *H01S 5/50* (2013.01); *H01S 5/125* (2013.01); *H01S 5/18311* (2013.01); *H01S 5/423* (2013.01)

(58) Field of Classification Search
CPC ........ H01S 5/50; H01S 5/125; H01S 5/18311; H01S 5/423

USPC .......................................................... 359/341
See application file for complete search history.

(56) References Cited

U.S. PATENT DOCUMENTS

| 4,897,845 A * | 1/1990 | Utaka ..................... B82Y 20/00 372/99 |
| 4,942,366 A * | 7/1990 | Toda ......................... H01S 5/10 359/344 |
| 9,793,676 B1 * | 10/2017 | Lee ...................... H01S 3/06754 |
| 2006/0165363 A1 * | 7/2006 | Kamiyama ............. H01S 5/026 359/344 |
| 2008/0198888 A1 * | 8/2008 | Arimoto ............... H01S 5/0424 359/344 |
| 2018/0059586 A1 | 3/2018 | Kondo et al. |

FOREIGN PATENT DOCUMENTS

JP           2018-32793 A       3/2018

* cited by examiner

*Primary Examiner* — Dalzid E Singh
(74) *Attorney, Agent, or Firm* — Sughrue Mion, PLLC

(57) ABSTRACT

A semiconductor optical amplifier includes: a light source part that is formed on a substrate, the substrate including a substrate surface; and an optical amplification part that amplifies propagation light propagating in a predetermined direction from the light source part and that emits the propagation light amplified in an emission direction intersecting with the substrate surface, the optical amplification part including a conductive region extending in the predetermined direction from the light source part along the substrate surface and a non-conductive region formed on a periphery of the conductive region, the conductive region including a reflection part that reflects the propagation light in a direction intersecting with the predetermined direction when viewed from a direction vertical to the substrate surface.

13 Claims, 6 Drawing Sheets

(a)

(b)

SEMICONDUCTOR OPTICAL AMPLIFIER, LIGHT OUTPUT APPARATUS, AND DISTANCE MEASURING APPARATUS

CROSS-REFERENCE TO RELATED APPLICATIONS

This application is based on and claims priority under 35 USC 119 from Japanese Patent Application No. 2018-115845 filed on Jun. 19, 2018 and Japanese Patent Application No. 2019-027828 filed on Feb. 19, 2019.

BACKGROUND

Technical Field

The present invention relates to a semiconductor optical amplifier, a light output apparatus, and a distance measuring apparatus, and particularly to the semiconductor optical amplifier using a distributed Bragg reflector waveguide, the light output apparatus using the semiconductor optical amplifier, and the distance measuring apparatus using the semiconductor optical amplifier.

Related Art

JP-A-2018-032793 discloses a light emitting element array including a plurality of semiconductor laminated structures, in connection with a semiconductor optical amplifier using a distributed Bragg reflector waveguide, each having a light emitting part formed on a substrate, and an optical amplification part which is extended from the light emitting part along a substrate surface of the substrate and has a longer length in an extension direction than that of the light emitting part and amplifies light propagating in the extension direction from the light emitting part and also emits the amplified light from a light emission part formed along the extension direction, wherein the plurality of semiconductor laminated structures are arranged so that the extension directions of the respective optical amplification parts are mutually substantially parallel.

SUMMARY

Aspect of non-limiting embodiments of the present disclosure relates to provide a semiconductor optical amplifier having a higher light output in a predetermined direction than that where a reflection part for reflecting propagation light propagating in the predetermined direction from a light source part in a direction intersecting with the predetermined direction is not provided in the semiconductor optical amplifier using a distributed Bragg reflector waveguide.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a semiconductor optical amplifier including: a light source part that is formed on a substrate, the substrate including a substrate surface; and an optical amplification part that amplifies propagation light propagating in a predetermined direction from the light source part and that emits the propagation light amplified in an emission direction intersecting with the substrate surface, the optical amplification part including a conductive region extending in the predetermined direction from the light source part along the substrate surface and a non-conductive region formed on a periphery of the conductive region, the conductive region including a reflection part that reflects the propagation light in a direction intersecting with the predetermined direction when viewed from a direction vertical to the substrate surface.

BRIEF DESCRIPTION OF DRAWINGS

Exemplary embodiment(s) of the present invention will be described in detail based on the following figures, wherein.

DETAILED DESCRIPTION

Hereinafter, the exemplary embodiments of the present invention will be described in detail below with reference to the drawings.

First Exemplary Embodiment

Figure 1:
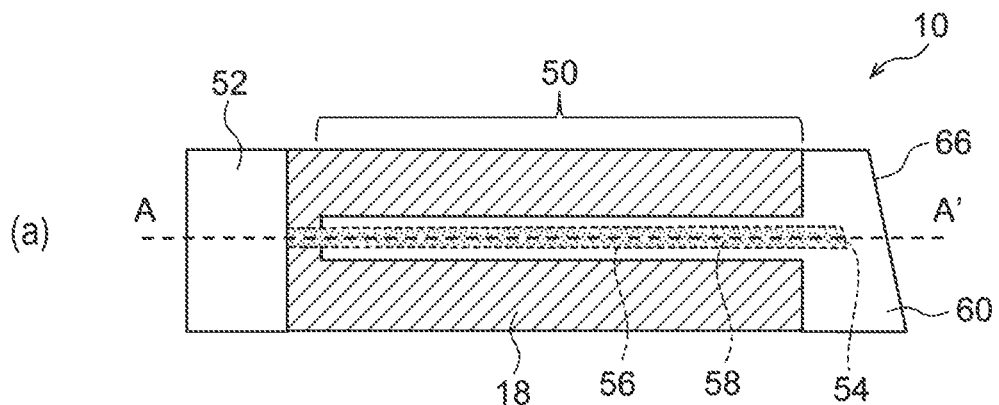
FIG. 1 shows an example of a configuration of a semiconductor optical amplifier according to a first exemplary embodiment, a plan view in (a), and a sectional view in (b)
Figure 1:
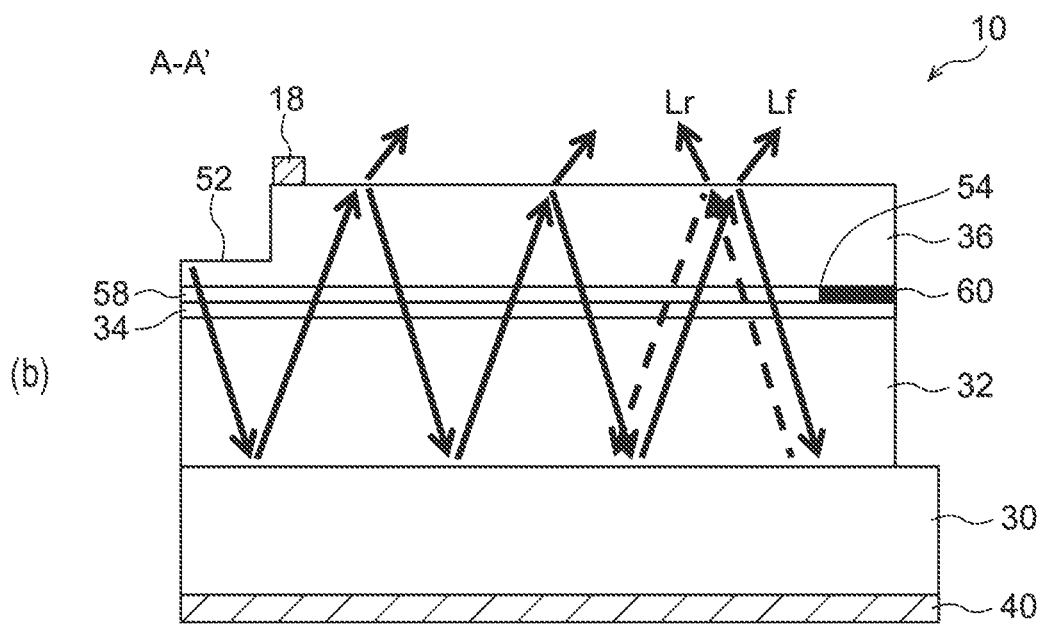

A semiconductor optical amplifier 10 according to the first exemplary embodiment will be described with reference to FIGS. 1 to 4. (a) of FIG. 1 is a plan view of the semiconductor optical amplifier 10, and (b) of FIG. 1 is a sectional view taken along line A-A' shown in (a) of FIG. 1. As shown in FIG. 1, the semiconductor optical amplifier (SOA) 10 includes an optical amplification part 50, a reflection part 54, and an optical coupling part 52.

The optical amplification part 50 has a function of amplifying light (seed light) coupled to the optical coupling part 52 and emitting the light. The optical coupling part 52 is one example of a light source part. The optical amplification part 50 according to the present exemplary embodiment is optical amplification part of a surface emitting type using a distributed Bragg reflector waveguide (hereinafter called a "DBR (Distributed Bragg Reflector) waveguide") of GaAs series by way of example. That is, the optical amplification part 50 is configured to include an N electrode 40 formed on a back surface of a substrate 30, a lower DBR 32 formed on the substrate 30, an active region 34, an upper DBR 36, a non-conductive region 60, a conductive region 58, and a P electrode 18.

In the present exemplary embodiment, the substrate 30 is an n-type GaAs substrate, and the N electrode 40 is formed on the back surface of the substrate 30. On the other hand, the lower DBR 32 according to the present exemplary embodiment has an n type, and the upper DBR 36 has a p type. In the case of driving the semiconductor optical amplifier 10, a positive electrode of a power source for driving is applied to the P electrode 18, and a negative electrode of the power source is applied to the N electrode 40, and a driving current is passed from the P electrode 18 to the N electrode 40. However, polarities of the substrate 30, the lower DBR 32 and the upper DBR 36 are not limited to these polarities, and these polarities may be reversed, that is, it may be constructed so that the substrate 30 is a p-type GaAs substrate and the lower DBR 32 has a p type and the upper DBR 36 has an n type.

The lower DBR 32 forms a resonator for contributing to light emission in the semiconductor optical amplifier 10 by being paired with the upper DBR 36 described below. The lower DBR 32 is a multilayer film reflector formed by alternately repeatedly laminating two semiconductor layers each having a film thickness of 0.25 $\lambda/n$ and a mutually different refractive index (where $\lambda$ is an oscillation wavelength of the semiconductor optical amplifier 10 and n is a refractive index of a medium (semiconductor layer)). As one concrete example, the lower DBR 32 is formed by alternately repeatedly laminating an n-type low refractive index layer made of $Al_{0.90}Ga_{0.1}As$ and an n-type high refractive index layer made of $Al_{0.2}Ga_{0.8}As$.

The active region 34 according to the present exemplary embodiment may be configured to include, for example, a lower spacer layer, a quantum well active region, and an upper spacer layer (not shown). The quantum well active region according to the present exemplary embodiment may be formed of, for example, barrier layers made of $Al_{0.3}Ga_{0.7}As$ in four layers and quantum well layers made of GaAs in three layers provided between the barrier layers. In addition, the lower spacer layer is arranged between the quantum well active region and the lower DBR 32, and the upper spacer layer is arranged between the quantum well active region and the upper DBR 36, thereby having a function of adjusting the length of the resonator and a function as a cladding layer for confining carriers.

The conductive region 58 and the non-conductive region 60 formed on the active region 34 is a p-type oxidization constriction layer, that is, current constriction layer. That is, the non-conductive region 60 corresponds to an oxidized region, and the conductive region 58 corresponds to a non-oxidized region. In the present exemplary embodiment, one layer of a multilayer film forming the upper DBR 36 is oxidized to form the non-conductive region 60 (the oxidized region), and a region other than the non-conductive region 60 in the one layer forms the non-oxidized conductive region 58 (the non-oxidized region). A current flowing from the P electrode 18 toward the N electrode 40 is constricted by the conductive region 58. In addition, in the present exemplary embodiment, a configuration where the non-conductive region 60 (the oxidized region) is formed on the one layer of the upper DBR 36 is illustrated and described, but is not limited to this configuration. A configuration where the non-conductive region 60 is formed on a plurality of layers of the upper DBR 36, and a configuration where the non-conductive region 60 is formed on the lower DBR 32 may be employed.

In the semiconductor optical amplifier 10 according to the present exemplary embodiment, an interface (hereinafter called an "oxidization front" 56) between the conductive region 58 and the non-conductive region 60 is extended in a propagation direction (direction from the left to the right on paper of FIG. 1) of propagation light which is introduced from the optical coupling part 52 and propagates through the DBR waveguide, and an end face of the oxidization front 56 opposite to the optical coupling part 52 forms the reflection part 54 by which the propagation light is reflected. The reflection part 54 according to the present exemplary embodiment is formed by the end face of the oxidization front 56 inclined in a direction intersecting with a traveling direction of the propagation light when viewed in plan view (when viewed from a direction vertical to the substrate 30) as shown in (a) of FIG. 1. The non-conductive region 60 is formed by oxidatively-treating the semiconductor optical amplifier formed in a mesa shape to a lower part of at least the upper DBR from the periphery in a manufacturing step of the semiconductor optical amplifier 10. Consequently, an external shape of the semiconductor optical amplifier 10 is provided with a portion along an external shape of the reflection part 54, that is, an inclined part 66 along the reflection part 54. The details of action etc. of the reflection part 54 will be described below. In addition, in the present exemplary embodiment, the configuration where the non-conductive region 60 is formed by oxidation is illustrated and described, but is not limited to this configuration. A configuration where the non-conductive region 60 is formed by, for example, ion implantation may be employed.

The upper DBR 36 is a multilayer film reflector formed by alternately repeatedly laminating two semiconductor layers each having a film thickness of 0.25 $\lambda/n$ and a mutually different refractive index. As one concrete example, the upper DBR 36 is formed by alternately repeatedly laminating a p-type low refractive index layer made of $Al_{0.90}Ga_{0.1}As$ and a p-type high refractive index layer made of $Al_{0.2}Ga_{0.8}As$.

The optical coupling part 52 according to the present exemplary embodiment is a site of coupling a light source for generating light (seed light) inputted to the semiconductor optical amplifier 10. In the present exemplary embodiment, the inputted light is propagated from an external light source (not shown) through an optical fiber, and an output end of the optical fiber is coupled to the optical coupling part 52 for functioning as a light source part of the semiconductor optical amplifier 10, and the inputted light is introduced into the DBR waveguide. As the external light source, for example, a vertical cavity surface emitting laser (VCSEL) is used. In addition, in the present exemplary embodiment, the configuration where the light source of the seed light is introduced from the outside is illustrated and described, but is not limited to this configuration. A configuration where a light emitting element (for example, the VCSEL) for functioning as the light source part is integrated with the semiconductor optical amplifier 10 in a region in which the optical coupling part 52 of the semiconductor optical amplifier 10 is arranged may be employed. In addition, in the present exemplary embodiment, the seed light is inputted and a current is injected into the semiconductor optical amplifier 10, thereby amplifying and outputting the seed light, but the seed light may be inputted to the side of a wavelength longer than a peak wavelength of a wavelength spectrum of a gain had by the active region 34. This may improve mode controllability. It is desirable to set the seed light at a wavelength having intensity one-tenth or less the peak intensity of a gain.

Here, the DBR waveguide according to the present exemplary embodiment will be described in more detail. Excitation light introduced from the optical coupling part 52 propagates in the propagation direction from the left to the right on paper. In this case, propagation light propagates through mainly the lower DBR 32, the active region 34, the conductive region 58 and the upper DBR 36 over predetermined distribution as shown in (b) of FIG. 1. Consequently, the "DBR waveguide" is configured to include these portions. In the present exemplary embodiment, the end (the oxidization front 56) of the conductive region 58 as a part of the DBR waveguide is formed with the reflection part 54, and the reflection part 54 reflects the propagation light. That is, since the non-conductive region 60 is formed by oxidizing the conductive region 58, a refractive index of the non-conductive region 60 is lower than that of the conductive region. As a result, an equivalent refractive index of a region of the DBR waveguide including the conductive region 58 becomes higher than an equivalent refractive index of the DBR waveguide including the non-conductive region 60, and the reflection part 54, which is the interface (the oxidization front 56) between the conductive region 58 and the non-conductive region 60, reflects the propagation light.

Incidentally, the semiconductor optical amplifier using the DBR waveguide is formed of a pair of DBRs formed on the semiconductor substrate, the active region and resonator spacer layers between the pair of DBRs. The region sandwiched between the DBRs functions as an optical waveguide, and light inputted into this DBR waveguide propagates in a slow light state while being multiply-reflected in an oblique direction. When a current is injected into the active region 34 by the P electrode 18 and the N electrode 40 formed on both sides of the DBRs at this time, the inputted light is amplified, and the amplified beam is outputted in a direction intersecting with a substrate surface and a direction (an oblique forward direction) forward inclined to the propagation direction of the DBR waveguide of the propagation light (hereinafter called a "forward output Lf"). On the other hand, output light which is reflected by a boundary pan opposite to the input side and is outputted in the direction intersecting with the substrate surface and a direction (an oblique backward direction) backward inclined to the propagation direction of the DBR waveguide of the propagation light is called a "backward output Lr".

In other words, a region of the semiconductor optical amplifier 10 formed with the P electrode 18 and the N electrode 40 (a region sandwiched between the P electrode 18 and the N electrode 40) has functions as both of the optical waveguide and the optical amplification part, and the amplified light is emitted in the direction intersecting with a surface of the substrate 30. That is, the semiconductor optical amplifier using the DBR waveguide forms semiconductor optical amplifier of a surface emitting type. On the other hand, a light input to this amplification part is formed by making an optical incident part (the optical coupling part 52) with reflectance decreased by removing a part of the DBR using etching and obliquely launching external light and coupling the optical incident part, or by laterally integrating a light source (a light emitting part) as a part of the semiconductor optical amplifier and propagating light leaking into the optical amplification part.

As described above, in the semiconductor optical amplifier using the DBR waveguide like the semiconductor optical amplifier 10, the output light including the forward output Lf and the backward output Lr different from the forward output Lf in an emission direction is outputted. Here, the semiconductor optical amplifier 10 inconveniently has two light output directions, and wants to have at least one of the two light output directions. In this case, it is desirable to have the forward output Lf. This is because, for the backward output Lr, for example, arrangement interference between an optical system for receiving light of the backward output Lr and an optical system coupled to the optical coupling part 52 tends to occur. On the other hand, for the forward output Lf, light is emitted in a direction away from the light source, so that, for example, interference between the optical systems becomes resistant to occurring.

However, light coupled and inputted to the optical coupling part 52, or light inputted from the integrated light emitting part propagates through a region sandwiched between the DBR pair, and the light is reflected by the boundary part (the reflection part 54) opposite to the input side, thereby generating return light. This case has a problem in that operation of the semiconductor optical amplifier becomes unstable and an amplified light output stable in the forward direction cannot be obtained.

Figure 6:
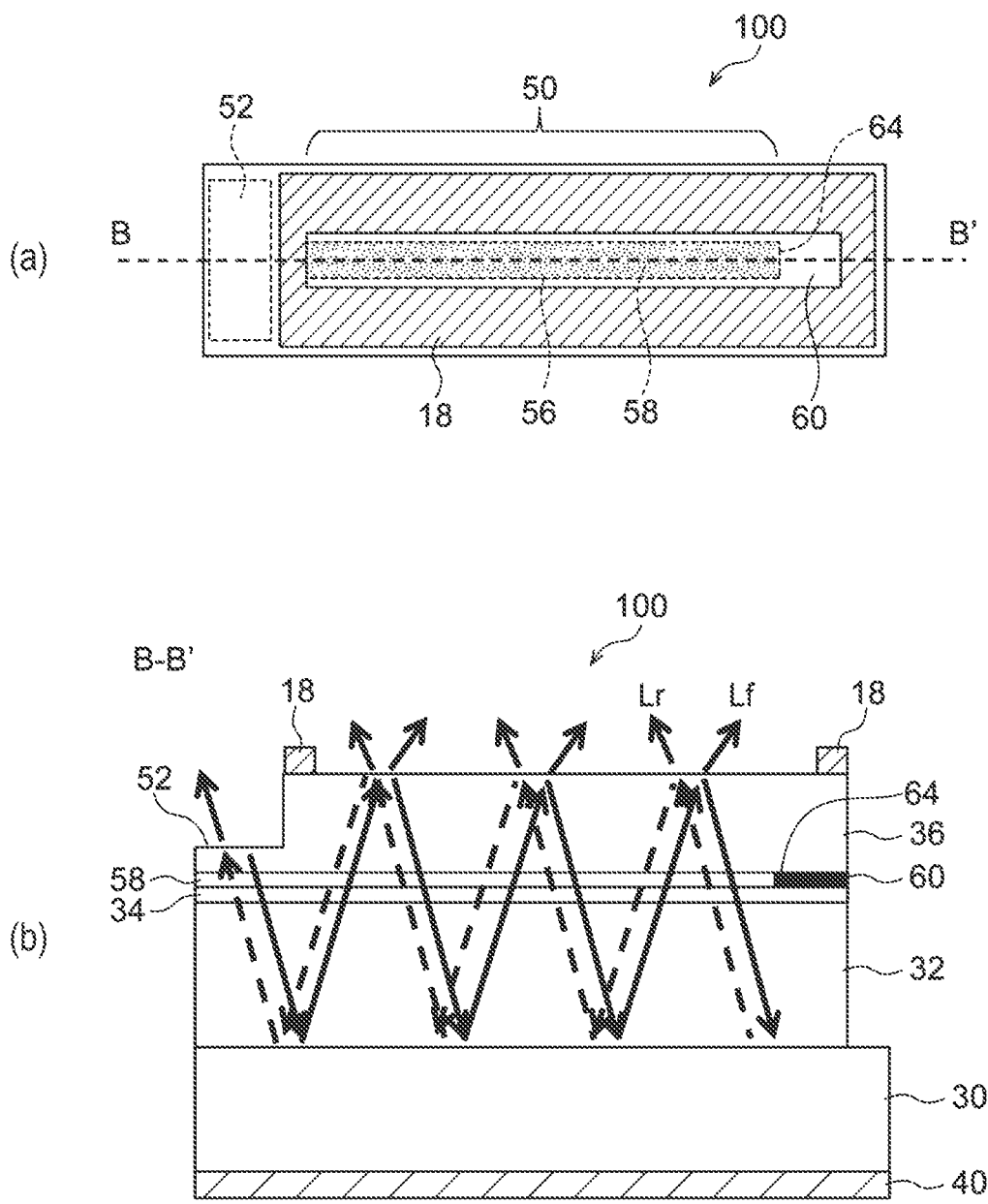
FIG. 6 shows a configuration of the semiconductor optical amplifier according to the comparative example, a plan view in (a), and a sectional view in (b).

The above problem will be described in more detail with reference to FIG. 6. FIG. 6 illustrates a semiconductor optical amplifier 100 according to a comparative example including an optical amplification part 50 and an optical coupling part 52 like the semiconductor optical amplifier 10 shown in FIG. 1. (b) of FIG. 6 is a sectional view taken along line B-B' shown in (a) of FIG. 6. In addition, in the following description, detailed description is omitted by assigning the same numerals to components similar to those of the semiconductor optical amplifier 10.

As shown in (a) of FIG. 6, the semiconductor optical amplifier 100 includes a conductive region 58 and a non-conductive region 60 with an oxidization front 56 set at a boundary. And, an end 64 opposite to the optical coupling part 52 in the conductive region 58 is orthogonal to a propagation direction of propagation light, that is, the end 64 is not inclined to the propagation direction of the propagation light.

In the semiconductor optical amplifier 100 having the above configuration, light inputted from the optical coupling part 52 is amplified while propagating in a direction of the end 64, and also is outputted as a forward output Lf in a direction forward inclined to the propagation direction. On the other hand, the propagation light reflected by the end 64 returns as return light in a direction of the optical coupling part 52, and also a backward output Lr is outputted in a direction backward inclined to the propagation direction. For the semiconductor optical amplifier 100, the backward output Lr is outputted over the whole DBR waveguide as shown in (b) of FIG. 6. As a result, in the semiconductor optical amplifier 100 according to the comparative example, the propagation light and the return light coexist, and light energy is distributed to the backward output Lr, thereby decreasing the forward output Lf. This is a mechanism of the occurrence of the above problem.

In order to address the above problem, the present exemplary embodiment provides the end of the DBR waveguide with the reflection part for reflecting the propagation light of the DBR waveguide in the semiconductor optical amplifier in the direction intersecting with the propagation direction. Accordingly, the return light is attenuated during propagation, and interference between the propagation light and the return light is suppressed, with the result that the semiconductor optical amplifier having a higher light output (the forward output Lf) in a predetermined direction than the case of the absence of such a reflection part is provided in the semiconductor optical amplifier of the surface emitting type.

Referring again to (a) of FIG. 1, since the reflection part 54 of the semiconductor optical amplifier 10 is inclined to the direction intersecting with the propagation direction of the propagation light, even when most of the propagation light is reflected by the reflection part 54, the reflected light does not return in the direction of the optical coupling part 52, and is attenuated and disappears on the way as shown in (b) of FIG. 1. Accordingly, the propagation light becomes dominant, with the result that light energy distribution to the backward output Lr is decreased, and light energy distributed to the forward output Lf is increased, that is, the forward output Lf is increased.

Figure 2:
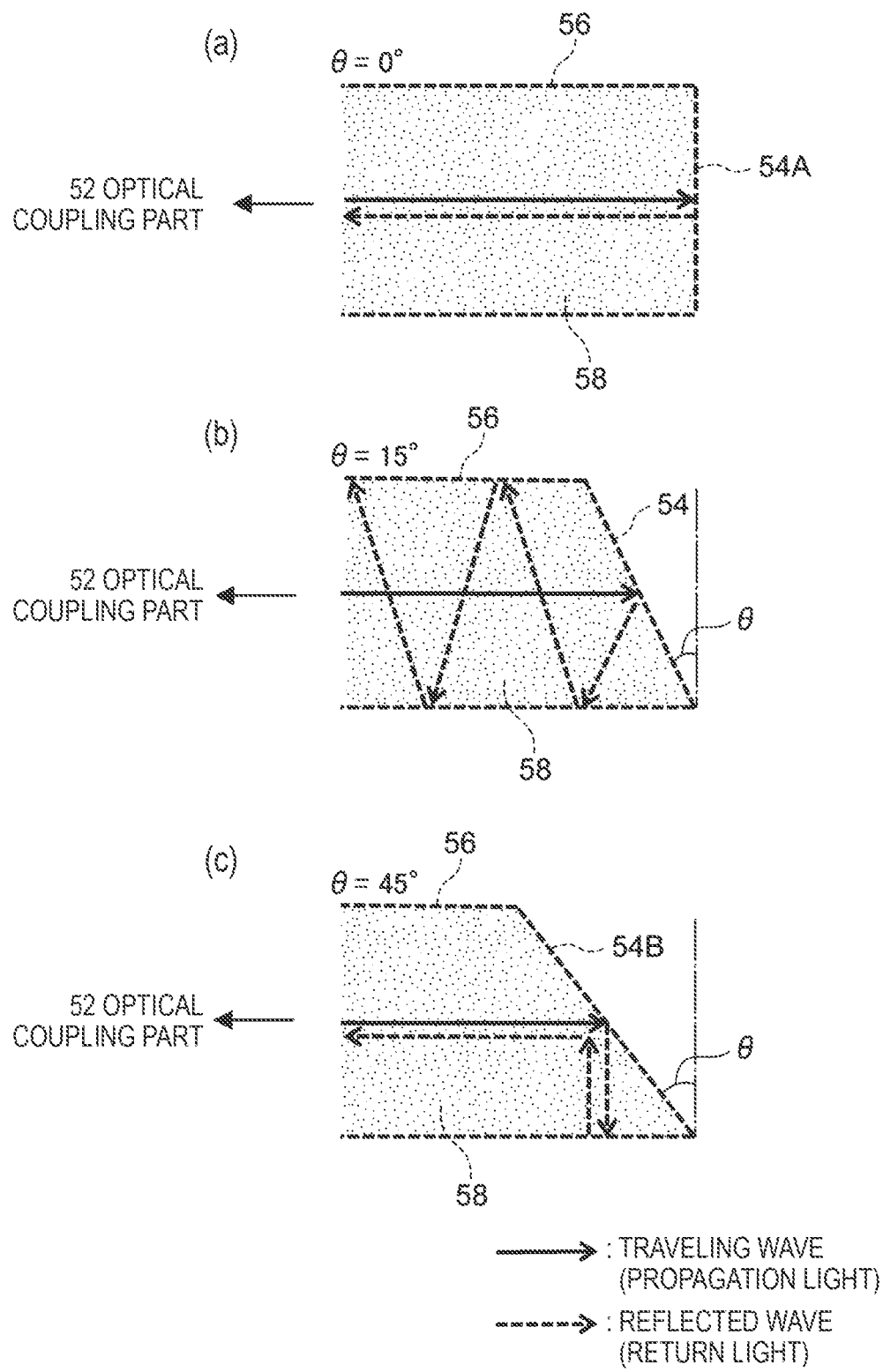
FIG. 2 shows a plan view showing reflection in a reflection part of a semiconductor optical amplifier according to a comparative example in (a), shows a plan view showing reflection in a reflection part of the semiconductor optical amplifier according to the first exemplary embodiment in (b), and shows a plan view showing reflection in the case where an inclination angle of the reflection part is 45° in (c)

Next, action of exerting the above effect of the semiconductor optical amplifier 10 will be described in more detail with reference to FIGS. 2 and 3. FIG. 2 is a view showing a difference between the propagation light (traveling wave) and the return light (reflected wave) in the case of a different inclination angle $\theta$ of the end of the conductive region. In the present exemplary embodiment, the inclination angle $\theta$ of the end is defined by an angle measured from a direction orthogonal to the propagation direction as shown in FIG. 2. That is, FIG. 2 shows, in (a), a reflection part 54A in the case where the inclination angle $\theta$ is $\theta=0°$. FIG. 2 shows, in (b), the reflection part 54 according to the present exemplary embodiment in the case where the inclination angle $\theta$ is $\theta=15°$. FIG. 2 shows, in (c), a reflection part 54B in the case where the inclination angle $\theta$ is $\theta=45°$. Here, the reflection part 54A shown in (a) of FIG. 2 corresponds to the end 64 of the semiconductor optical amplifier 100 shown in FIG. 6. In addition, optical paths of the propagation light and the return light shown in FIG. 2 show only the main optical paths.

When the inclination angle $\theta$ is 0° as shown in (a) of FIG. 2, the propagation light reflected by the reflection part 54A returns in the direction of the optical coupling part 52 following the same optical path as an incident optical path as the return light. When the inclination angle $\theta$ is 45° as shown in (c) of FIG. 2, the propagation light reflected by the reflection part 54B is once reflected in the direction orthogonal to the direction of the propagation light, but is again reflected by the reflection part 54B, and the propagation light returns in the direction of the optical coupling part 52 following the same optical path as the incident optical path as the return light. On the other hand, when the inclination angle $\theta$ is 15°, the propagation light is reflected by the reflection part 54 and then is reflected in the oxidization front 56. In a process of this reflection, the return light disappears on the way as shown in (b) of FIG. 1, thus decreasing the backward output Lr. As a result, the output light may be concentrated on the forward output Lf in the semiconductor optical amplifier 10 according to the present exemplary embodiment.

Figure 3:
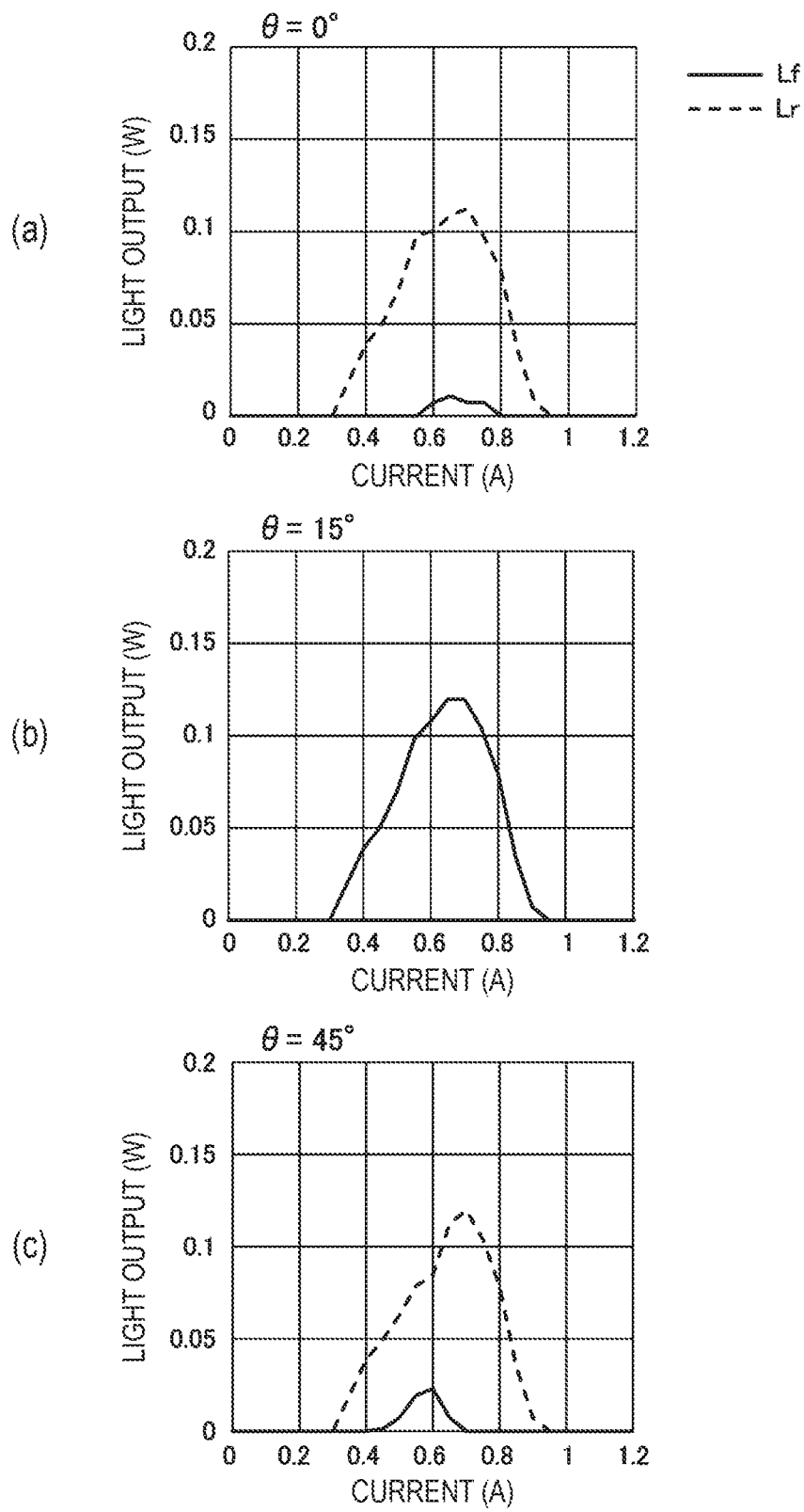
FIG. 3 shows a graph showing light output characteristics of the semiconductor optical amplifier according to the comparative example in (a), shows a graph showing light output characteristics of the semiconductor optical amplifier according to the first exemplary embodiment in (b), and shows a graph showing light output characteristics in the case where the inclination angle of the reflection part is 45° in (c)

FIG. 3 shows the light output of the semiconductor optical amplifier with the reflection part configured as shown in each view of FIG. 2, and (a) of FIG. 3 shows the forward output Lf and the backward output Lr in the case where the inclination angle $\theta$ is 0°, and (b) of FIG. 3 shows the forward output Lf and the backward output Lr in the case where the inclination angle $\theta$ is 15°, and (c) of FIG. 3 shows the forward output Lf and the backward output Lr in the case where the inclination angle $\theta$ is 45°. The forward output Lf and the backward output Lr are measured by two light receiving means arranged in directions of the respective light outputs.

When the inclination angle $\theta$ is 0° as shown in (a) of FIG. 3, most of the light output is the backward output Lr, and the forward output Lf is only slightly outputted. Also, when the inclination angle $\theta$ is 45° as shown in (c) of FIG. 3, most of the light output is the backward output Lr, and the forward output Lf is only slightly outputted. On the other hand, when the inclination angle $\theta$ is 15°, it is found that most of the light output is the forward output Lf and the backward output Lr is hardly generated. In addition, the inclination angle $\theta$ according to the present exemplary embodiment is not particularly limited, but is preferably angles from 5° to 85° (both inclusive). Also, the inclination angle $\theta$ is preferably an angle other than 45°.

Figure 4:
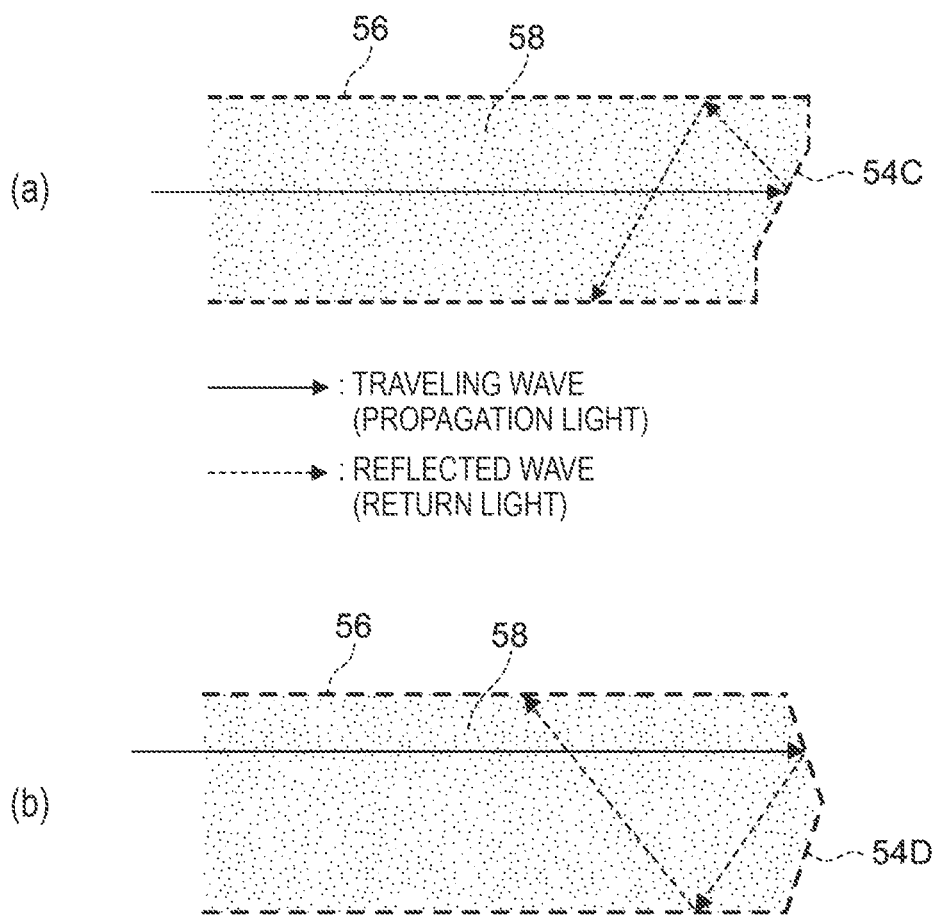
FIG. 4 shows modified examples of the reflection part of the semiconductor optical amplifier according to the first exemplary embodiment in (a) and (b)

Here, a shape of the reflection part 54 forming the end of the conductive region 58 will be described with reference to FIG. 4. In (a) of FIG. 1, the configuration where one plane of the oxidization front 56 in the direction intersecting with the propagation direction is provided as the reflection part 54 is illustrated and described, but is not limited to this configuration. For example, as shown in (a) of FIG. 4, a part of the end of the conductive region 58 may be formed with a reflection part 54C having a reflection surface inclined to the propagation direction. Or, as shown in (b) of FIG. 4, the end of the conductive region 58 may be formed with a reflection part 54D having two inclined surfaces mutually oppositely inclined to the propagation direction. The reflection part 54C or 54D also has an effect similar to that of the reflection part 54.

Second Exemplary Embodiment

Next, a light output apparatus and a distance measuring apparatus according to the second exemplary embodiment will be described with reference to FIG. 5. (a) of FIG. 5 shows a block diagram of a light processing apparatus 70 as one example of the light output apparatus according to the invention, and (b) of FIG. 5 shows a block diagram of a distance measuring apparatus 90.

Figure 5:
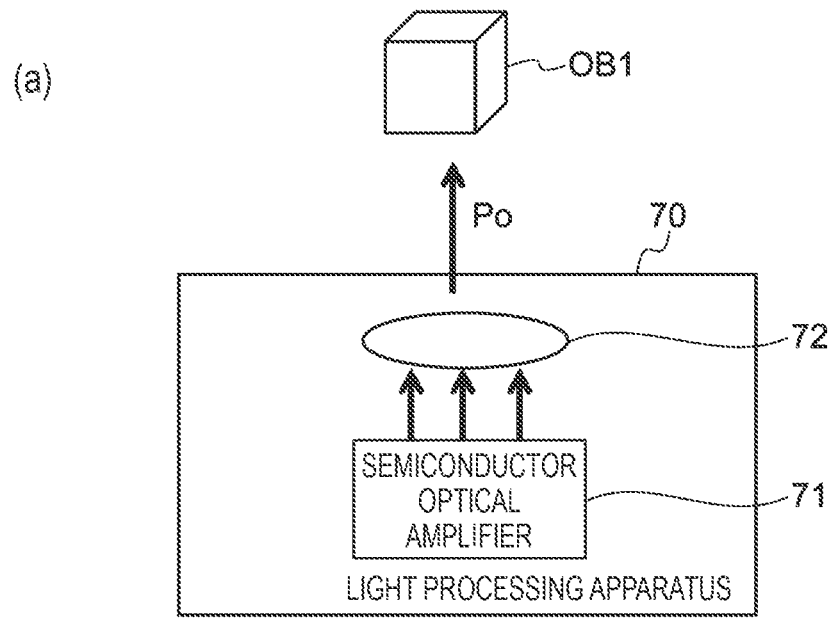
FIG. 5 shows a block diagram showing one example of a light processing apparatus according to a second exemplary embodiment in (a), and shows a block diagram showing one example of a distance measuring apparatus according to the second exemplary embodiment in (b)
Figure 5:
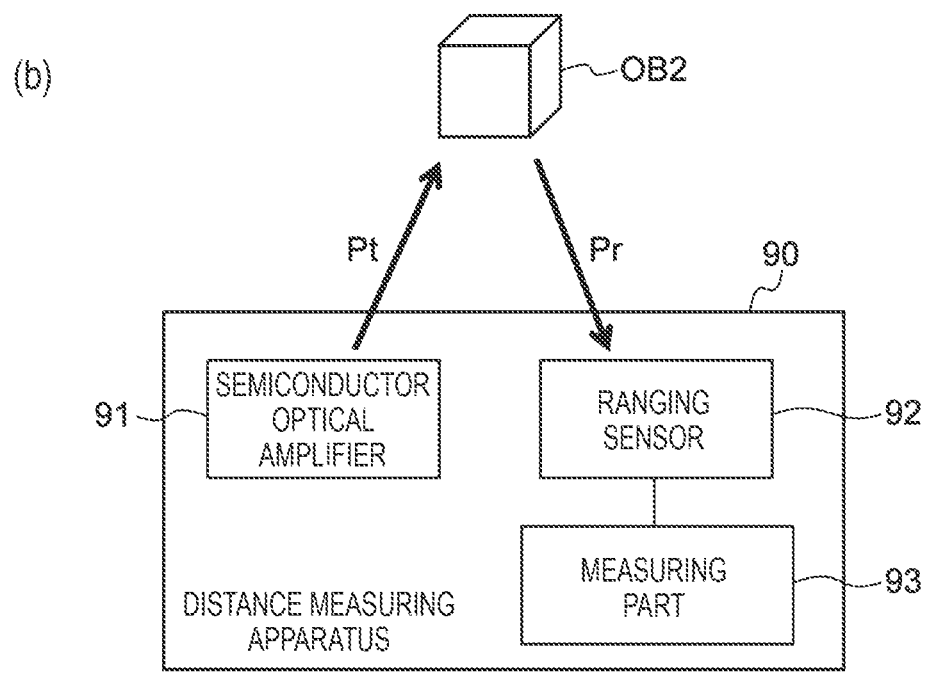

As shown in (a) of FIG. 5, the light processing apparatus 70 includes a semiconductor optical amplifier 71 and a light collecting lens 72. The semiconductor optical amplifier 71 is, for example, the semiconductor optical amplifier 10 according to the above exemplary embodiment. As shown in (a) of FIG. 5, light emitted from the semiconductor optical amplifier 71 is collected by the lens 72, and a workpiece OB1 is irradiated with the light as output light Po, and processing on the workpiece OB1 is performed.

On the other hand, as shown in (b) of FIG. 5, the distance measuring apparatus 90 includes a semiconductor optical amplifier 91, a ranging sensor 92, and a measuring part 93. The semiconductor optical amplifier 91 is, for example, the semiconductor optical amplifier 10 according to the above exemplary embodiment. Also, the ranging sensor 92 is formed of, for example, a light receiving element such as a photodiode, and the measuring part 93 is mainly formed of a semiconductor element such as a CPU and an ASIC.

In the distance measuring apparatus 90, a measured object OB2 (for example, a person or an object) is irradiated with projection light Pt emitted from the semiconductor optical amplifier 91, and reflected light reflected by the measured object OB2 is inputted to the ranging sensor 92 as receiving light Pr. The receiving light Pr inputted to the ranging sensor 92 is converted into an electrical signal, and based on the electrical signal, predetermined arithmetic processing is performed in the measuring part 93 to measure, for example, a distance between the distance measuring apparatus 90 and the measured object OB2.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor optical amplifier comprising:
   a light source part that is formed on a substrate, the substrate including a substrate surface; and
   an optical amplification part that amplifies propagation light propagating in a predetermined direction from the light source part and that emits the propagation light amplified in an emission direction intersecting with the substrate surface, the optical amplification part including a conductive region extending in the predetermined direction from the light source part along the substrate surface and a non-conductive region formed on a periphery of the conductive region, the conductive region including a reflection part that reflects the propagation light in a direction intersecting with the predetermined direction when viewed from a direction vertical to the substrate surface.

2. The semiconductor optical amplifier according to claim 1, wherein the emission direction is a direction inclined to the predetermined direction.

3. The semiconductor optical amplifier according to claim 2, wherein the reflection part is an end face of the conductive region inclined at a predetermined angle with respect to the predetermined direction when viewed from the direction vertical to the substrate surface.

4. The semiconductor optical amplifier according to claim 3, wherein the predetermined angle is an angle equal to or greater than 5° and equal to or smaller than 85°.

5. The semiconductor optical amplifier according to claim 4, wherein the predetermined angle is an angle other than 45°.

6. The semiconductor optical amplifier according to claim 3, wherein the predetermined angle is an angle other than 45°.

7. The semiconductor optical amplifier according to claim 1, wherein the reflection part is an end face of the conductive region inclined at a predetermined angle with respect to the predetermined direction when viewed from the direction vertical to the substrate surface.

8. The semiconductor optical amplifier according to claim 7, wherein the predetermined angle is an angle equal to or greater than 5° and equal to or smaller than 85°.

9. The semiconductor optical amplifier according to claim 8, wherein the predetermined angle is an angle other than 45°.

10. The semiconductor optical amplifier according to claim 7, wherein the predetermined angle is an angle other than 45°.

11. The semiconductor optical amplifier according to claim 1, further comprising
    a first semiconductor multilayer film reflector of a first conductivity type that is formed on the substrate,
    an active region on the first semiconductor multilayer film reflector, and
    a second semiconductor multilayer film reflector of a second conductivity type on the active region,
    wherein the conductive region is configured to include the active region, and
    the non-conductive region is an oxidized region or an ion implantation region formed in a part of at least one of the first semiconductor multilayer film reflector and the second semiconductor multilayer film reflector.

12. A light output apparatus comprising:
    the semiconductor optical amplifier according to claim 1; and
    a light collecting part that collects light emitted from the semiconductor optical amplifier.

13. A distance measuring apparatus comprising:
    the semiconductor optical amplifier according to claim 1;
    a light receiving part that receives reflected light, the reflected light being light which is emitted from the semiconductor optical amplifier and is reflected by a measured object; and
    a measuring part that measures a distance to the measured object based on the reflected light received by the light receiving part.

* * * * *